United States Patent
Chin

(10) Patent No.: US 8,522,436 B2
(45) Date of Patent: Sep. 3, 2013

(54) METHOD FOR MOUNTING FINS ONTO ANNULAR SEAT

(76) Inventor: Li-Hua Chin, Taipei County (TW)

( * ) Notice: Subject to any disclaimer, the term of this patent is extended or adjusted under 35 U.S.C. 154(b) by 439 days.

(21) Appl. No.: 12/857,585

(22) Filed: Aug. 17, 2010

(65) Prior Publication Data
US 2011/0197417 A1 Aug. 18, 2011

(30) Foreign Application Priority Data
Feb. 12, 2010 (TW) .............................. 99104609 A

(51) Int. Cl.
*B21D 53/06* (2006.01)
*B23P 15/26* (2006.01)

(52) U.S. Cl.
USPC .............. 29/890.046; 29/890.03; 29/890.035; 29/890.045; 29/726; 29/33 G

(58) Field of Classification Search
USPC ................... 29/890.03–890.07, 726, 33 G
See application file for complete search history.

(56) References Cited

U.S. PATENT DOCUMENTS
8,365,407 B2 * 2/2013 Wei ............................ 29/890.03

* cited by examiner

*Primary Examiner* — Richard Chang

(57) ABSTRACT

The method for mounting fins onto an annular seat of the invention includes the steps of: a) providing a forming machine for forming sheet metal from a material; b) cutting the sheet metal to form a plurality of fins; c) providing an annular seat placed on a rotary support and having slots; and d) one by one embedding the fins into the slots with rotation of the annular seat.

7 Claims, 9 Drawing Sheets

METHOD FOR MOUNTING FINS ONTO ANNULAR SEAT

BACKGROUND OF THE INVENTION

1. Technical Field

The invention relates to heat sinks, particularly to manufacture of heat sinks.

2. Related Art

A heat sink applied in electronic apparatuses briefly includes a seat and fins mounted thereon. First, the fins must be accurately embedded into the slots on the seat, then soldered or pressed to be a unity.

Traditionally, embedding the fins onto the seat is implemented by manual labor. That is to say, each of the fins is embedded into one of the slots in sequence. To be obvious, this method is so uneconomical and inaccurate.

Some manufactures adopt another way to assemble the fins and seat. First, fins are arranged on a tool or combined by interlinking to form a fin module. Then the fin module is connected with a seat by soldering or pressing. In other words, the fin module and seat must be formed individually, and then combined with each other.

Neither of the abovementioned methods can be completed in a single process. The production efficiency, accuracy and yield rate is not good enough.

SUMMARY OF THE INVENTION

A primary object of the invention is to provide a method for mounting fins onto an annular seat, in which forming fins and mounting them onto a seat can be performed in a single process, so that the manufacture process can be simplified and the production accuracy can be enhanced.

A secondary object of the invention is to provide a method for mounting fins onto an annular seat, which can increase production efficiency and yield rate.

To accomplish the above objects, the method of the invention includes the steps of: a) providing a forming machine for forming sheet metal from a material; b) cutting the sheet metal to form a plurality of fins; c) providing an annular seat placed on a rotary support and having slots; and d) one by one embedding the fins into the slots with rotation of the annular seat.

DETAILED DESCRIPTION OF THE INVENTION

Figure 1:
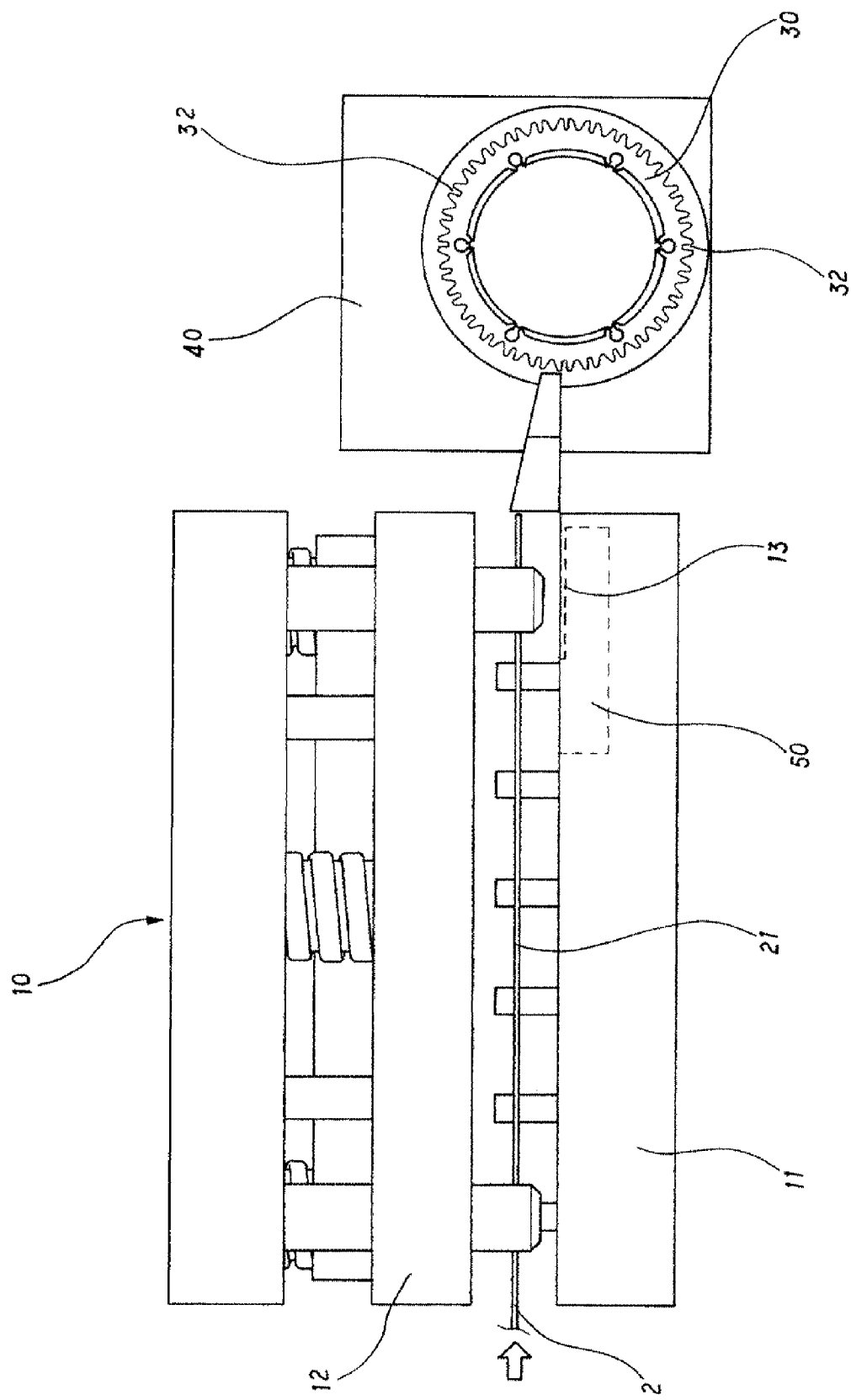
FIG. 1 shows the arrangement of the invention.
Figure 2:
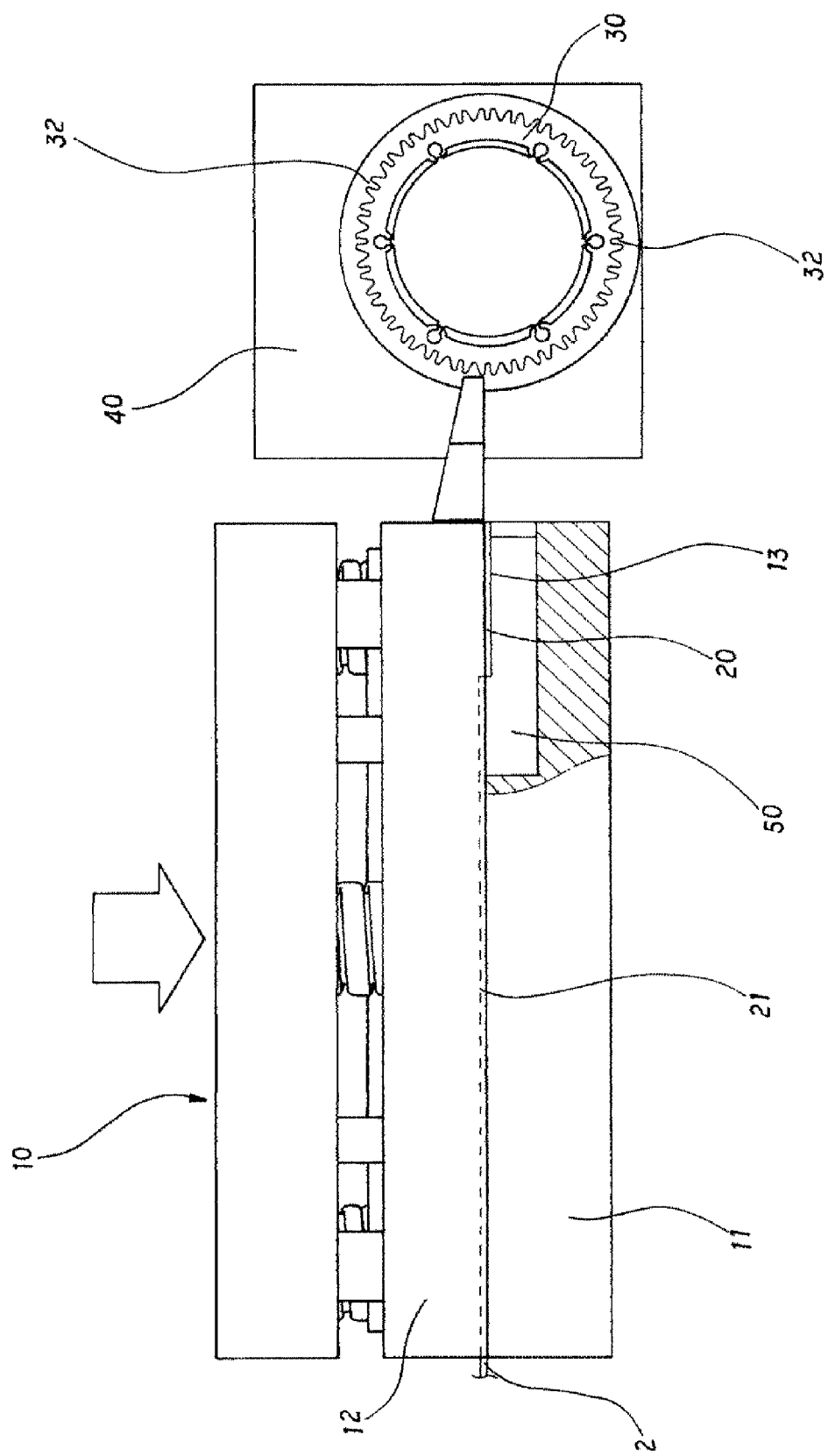
FIG. 2 shows that a fin is formed and accommodated in the trough.
Figure 5:
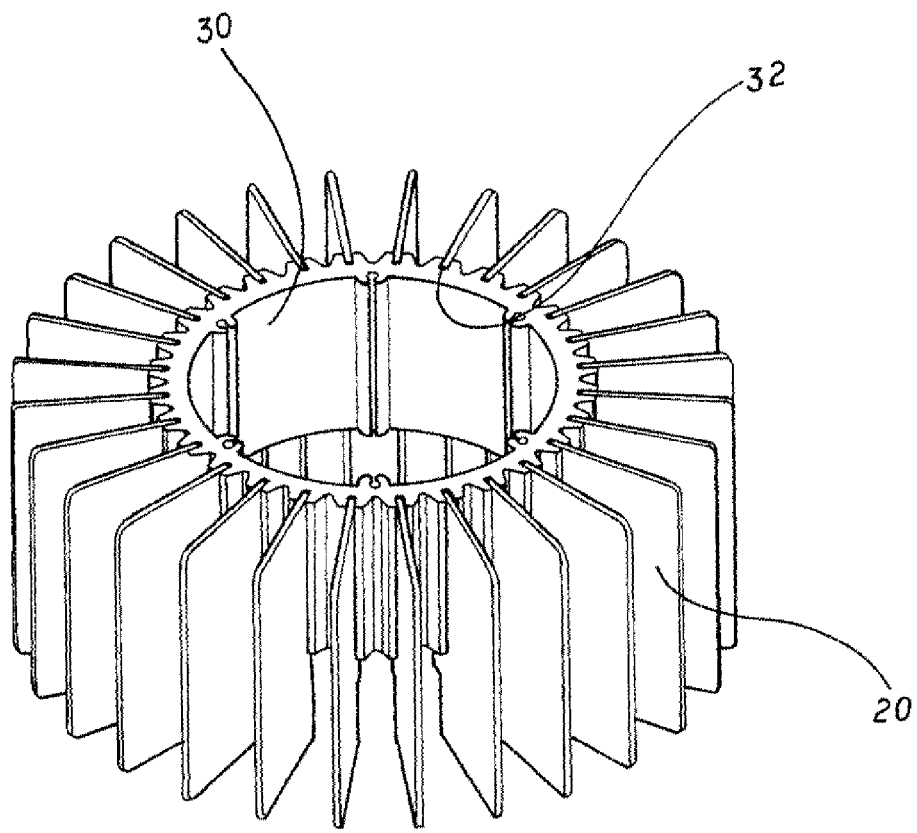
FIG. 5 shows the heat sink made by the method of the invention.
Figure 6:
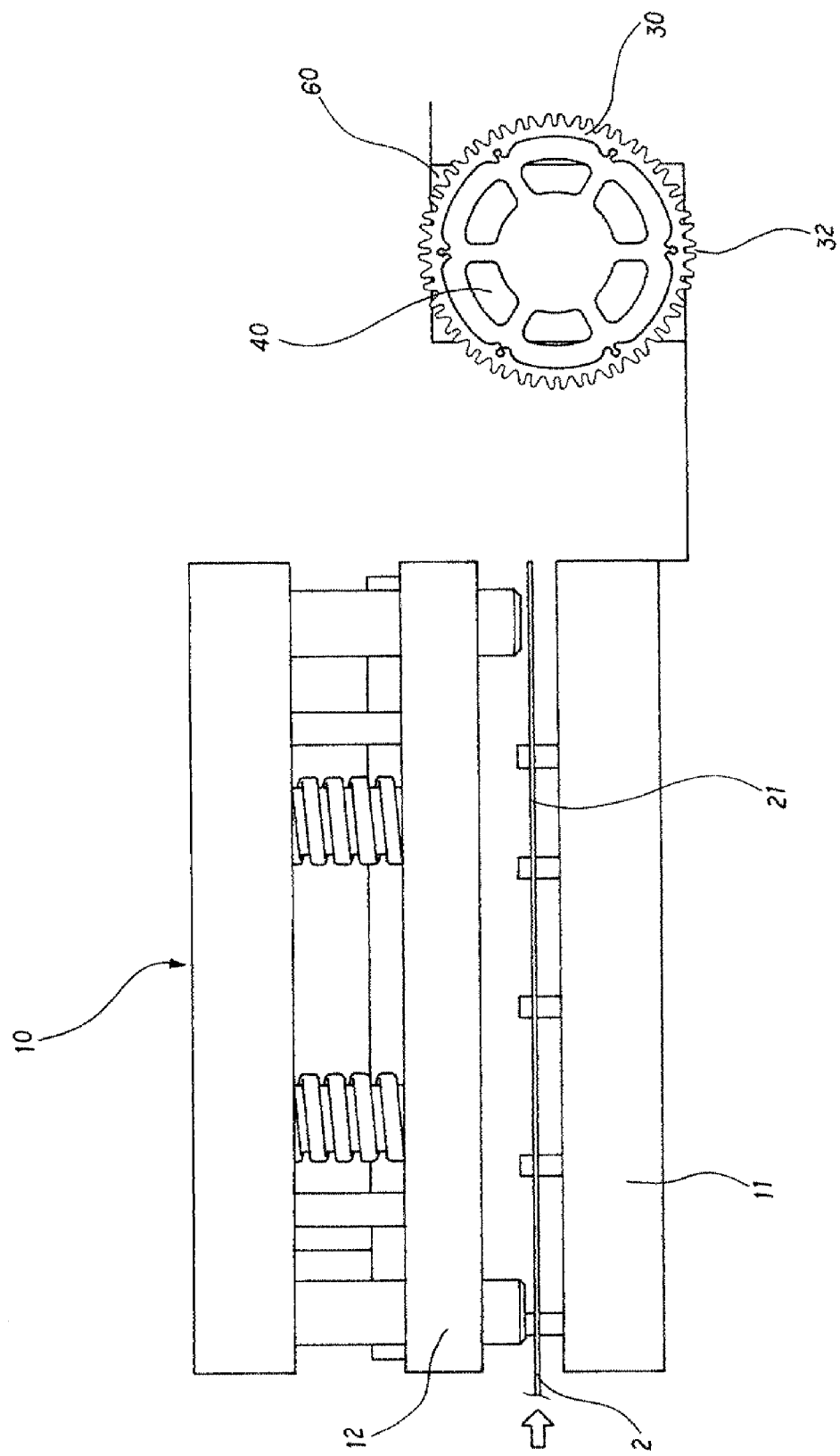
FIG. 6 shows the arrangement of the second embodiment of the invention.
Figure 7:
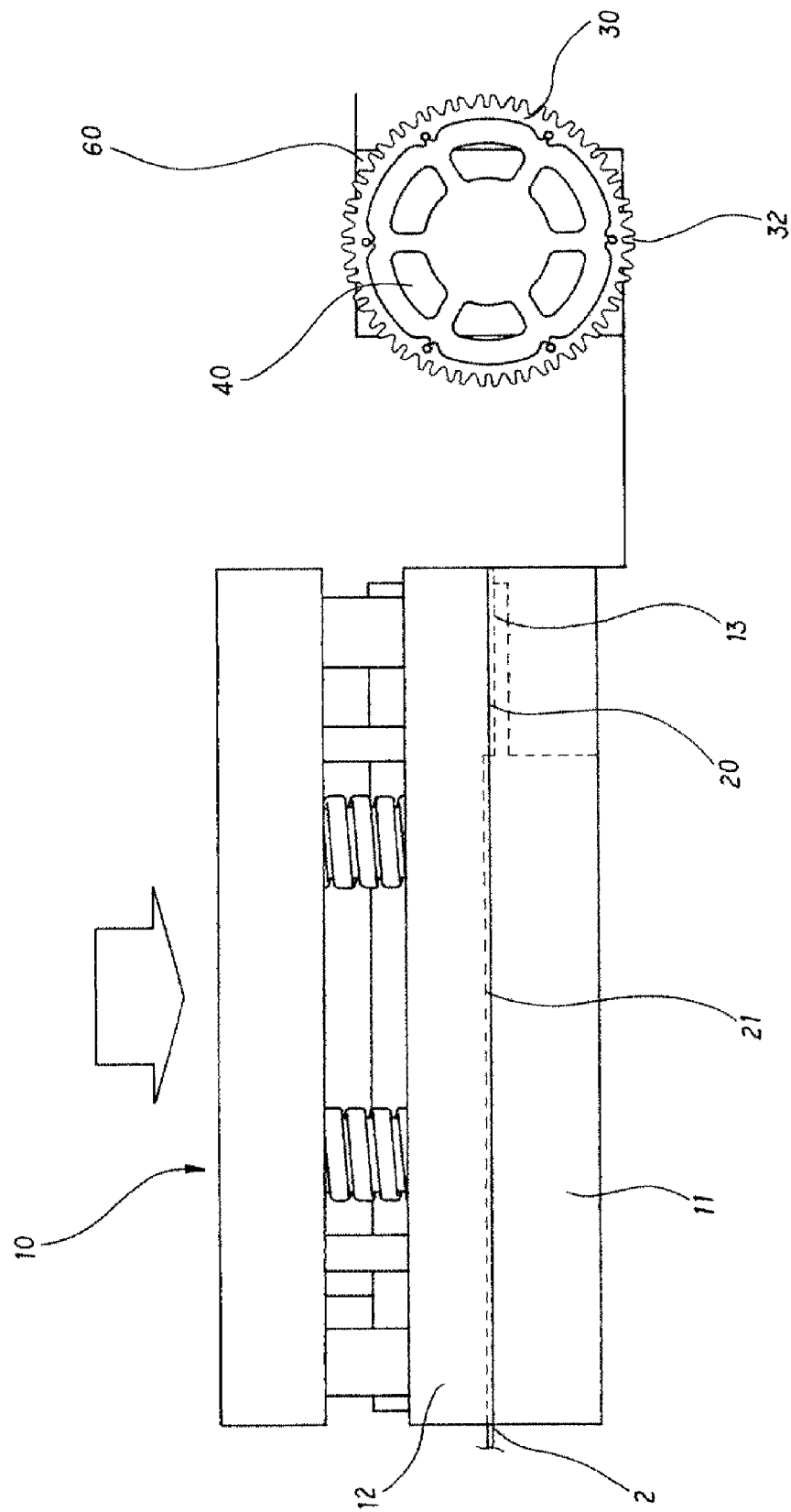
FIG. 7 shows that a fin is formed and accommodated in the trough, in the second embodiment.
Figure 8:
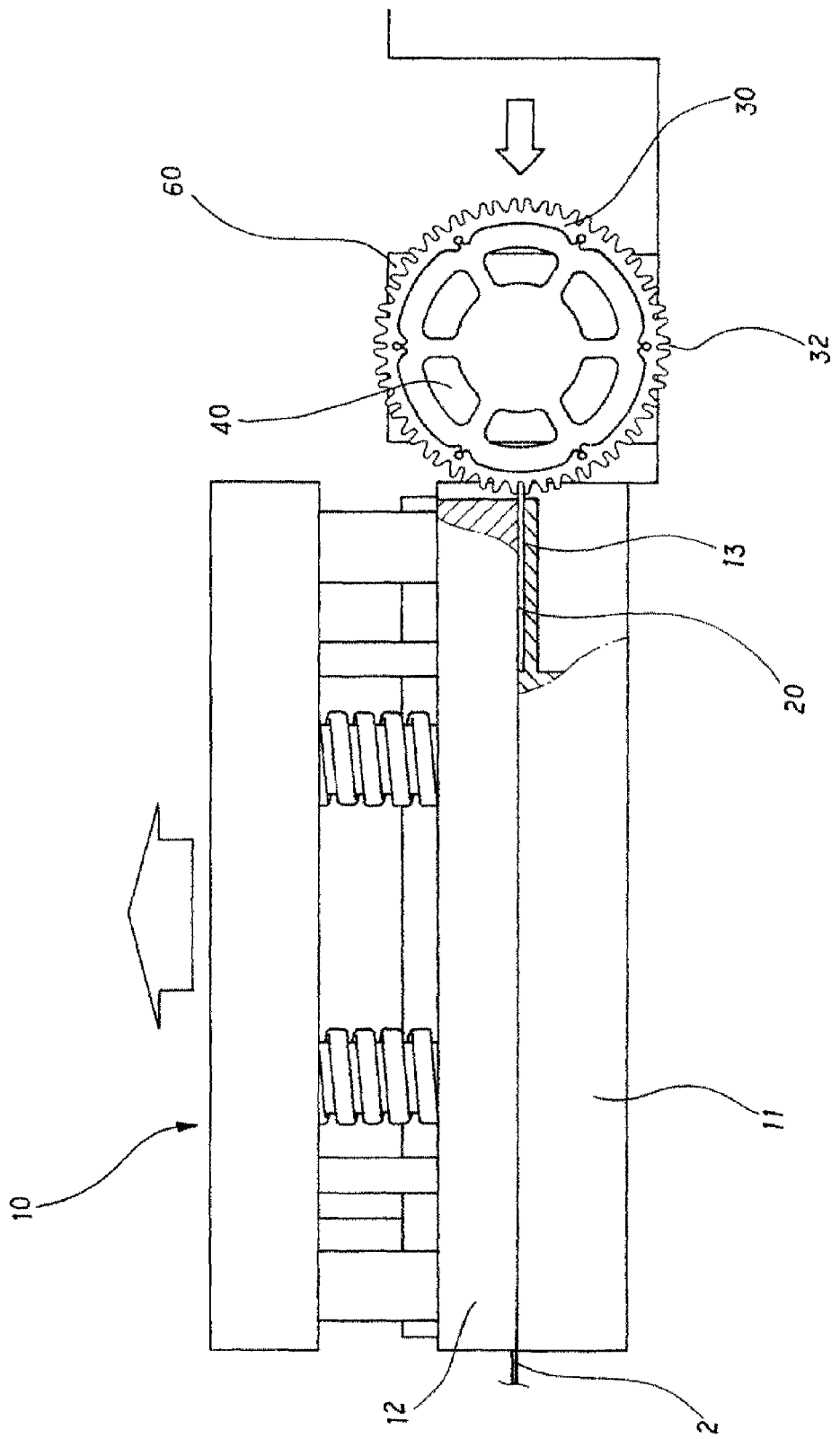
FIG. 8 shows that the first fin is moved to be embedded into the slot, in the second embodiment.
Figure 9:
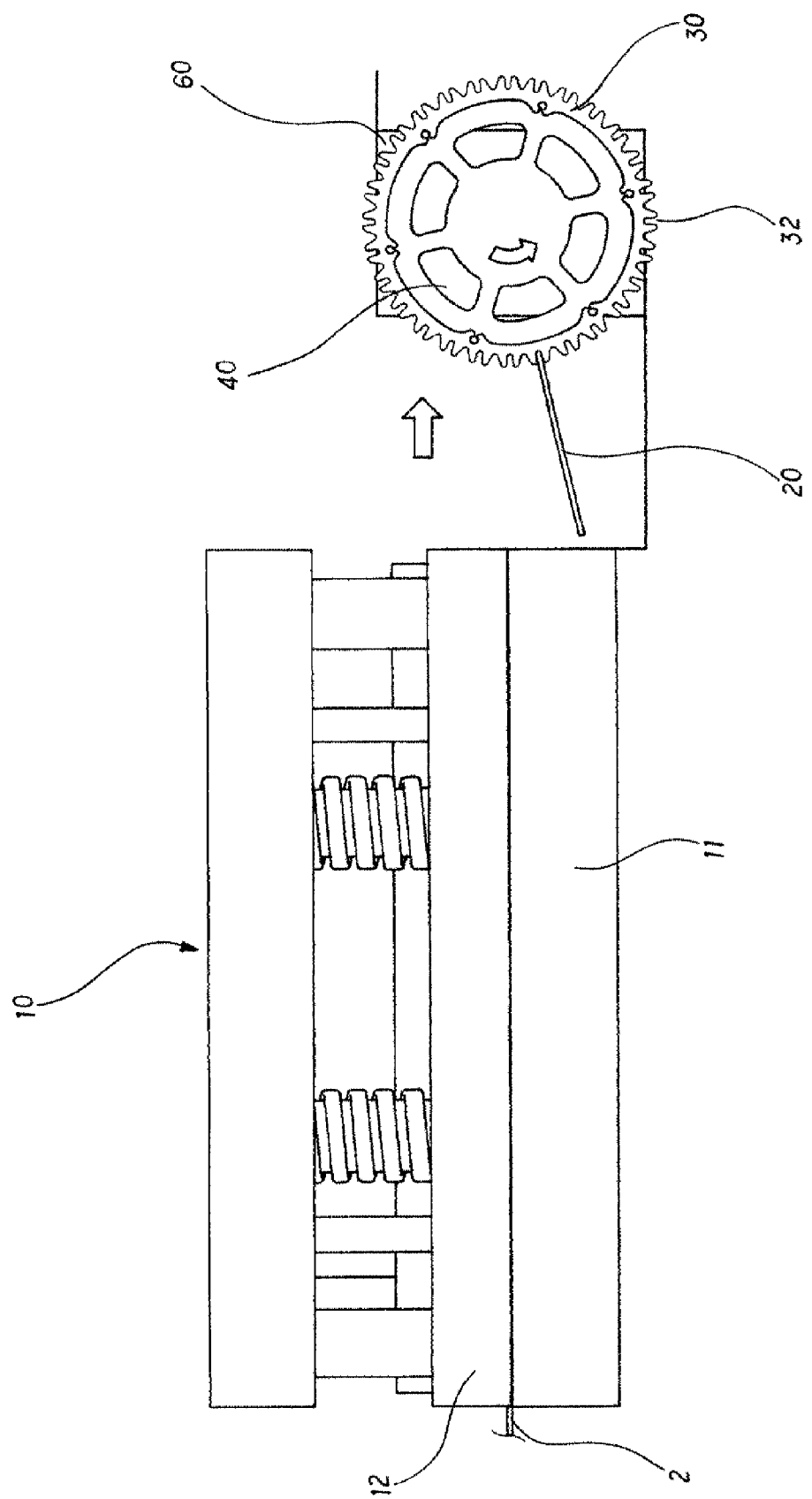
FIG. 9 shows that the annular seat is rotated to a next position after the first fin is completed, in the second embodiment.

Please refer to FIGS. 1-4. The method for mounting fins onto an annular seat of the invention including the steps of:

a) providing a forming machine 10 for forming sheet metal 21 from a material 2;

b) cutting the sheet metal 21 to form a plurality of fins 20 as shown in FIG. 2;

c) placing the annular seat 30 on a rotary support 40, wherein the annular seat 30 is provided with slots 32 on its outer surface; and d) one by one embedding the fins 20 into the slots 32 with rotation of the annular seat 30 as shown in FIG. 5, wherein the fins 20 are conveyed by a power source 50 such as a motor, hydraulic cylinder or robot hand.

Figure 3:
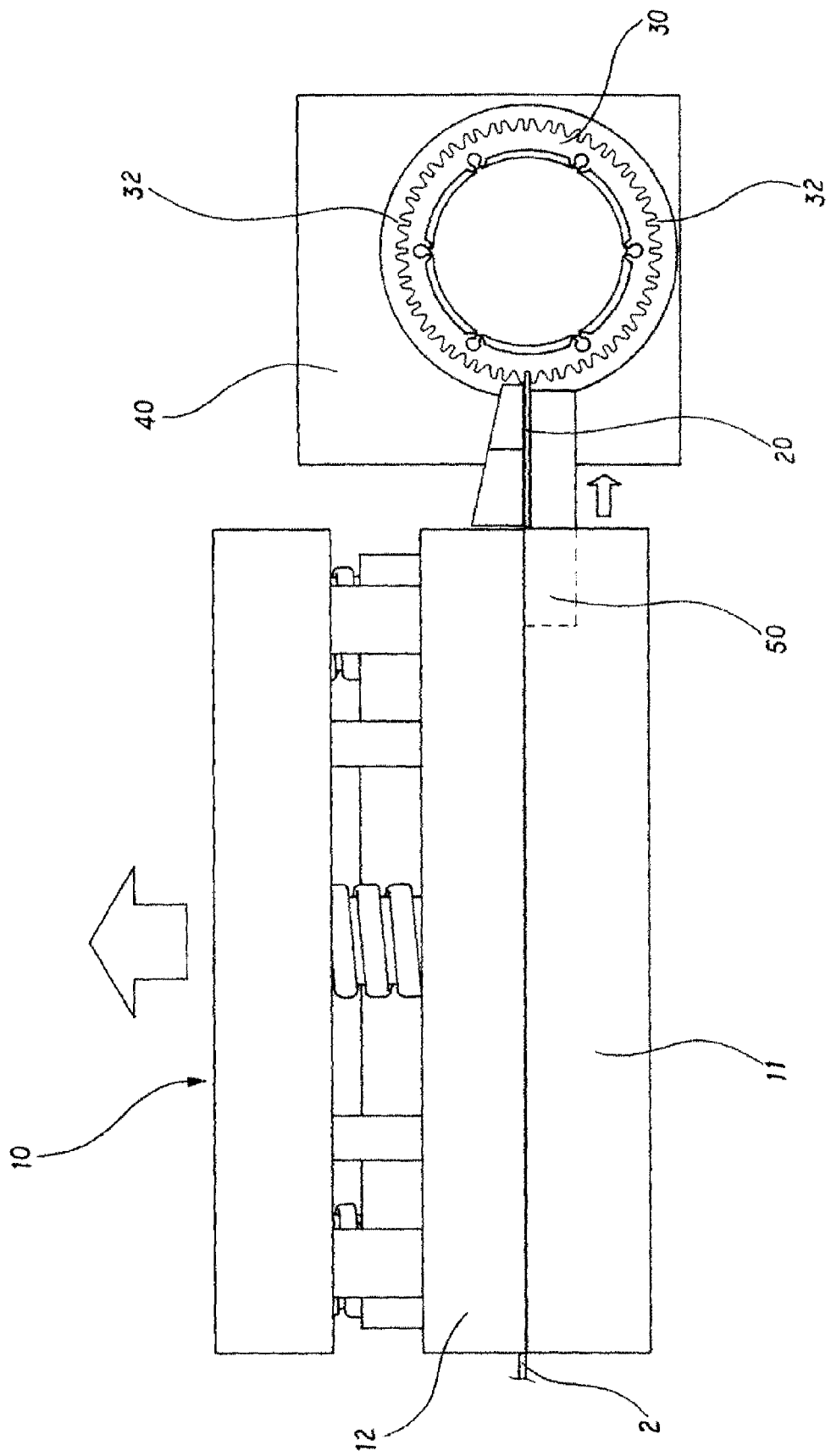
FIG. 3 shows that the first fin is moved to be embedded into the slot.
Figure 4:
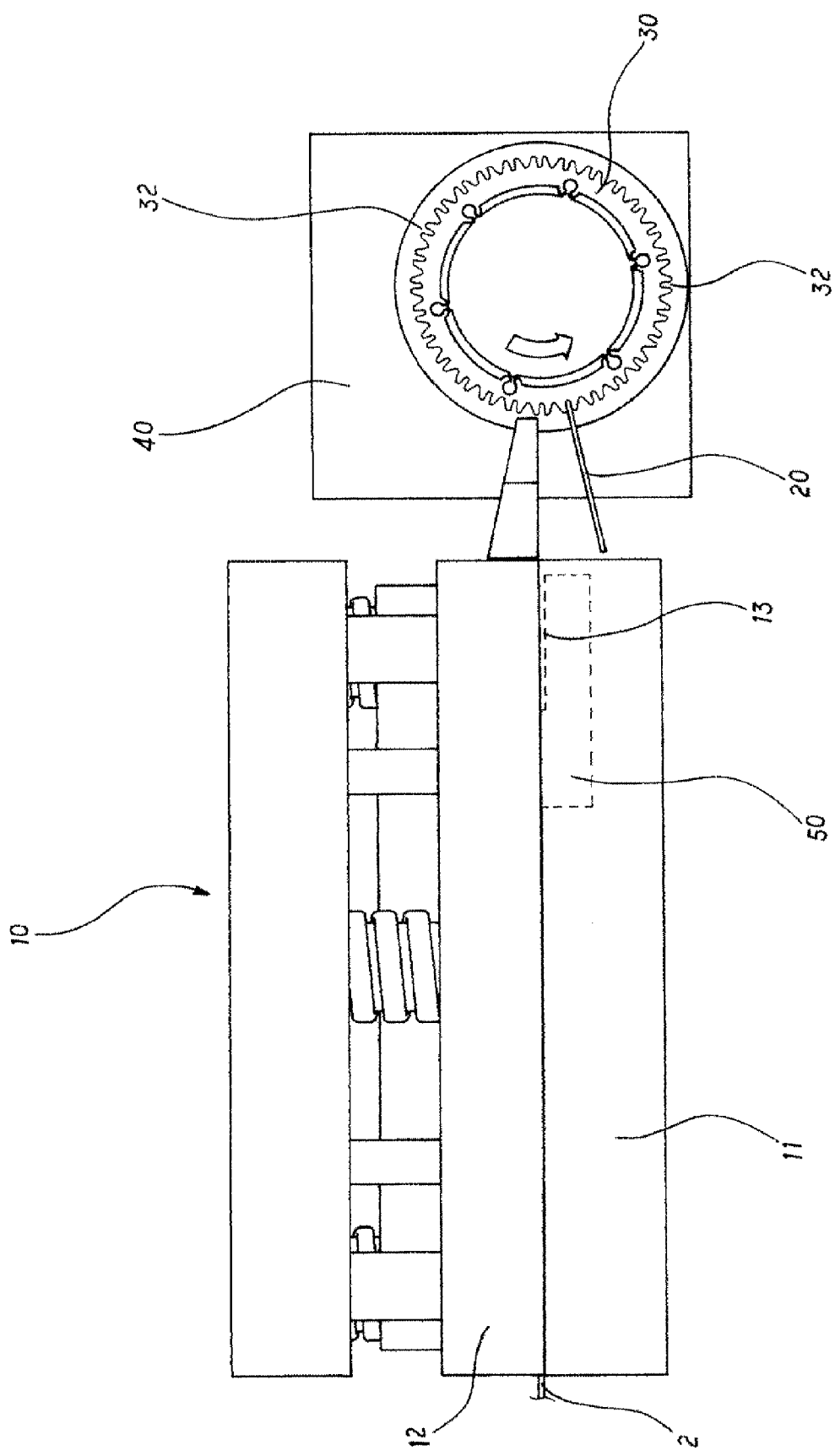
FIG. 4 shows that the annular seat is rotated to a next position after the first fin is completed.

In the embodiment shown in FIGS. 2 and 3, the forming machine 10 includes a punching machine 11 and a mold set 12 as shown in FIG. 2. The material 2 of fins 20 is conveyed by the punching machine 11 and pressed by the mold set 12 to form the sheet metal 21.

The forming machine 10 further includes a trough 13 for accommodating the fin 20. The trough 13 is driven by the power source 50 to convey the fin 20 so as to embed the fin 20 into the slots 32.

The rotary support 40 and power source 50 are controlled by a controller (not shown). The controller makes the rotary support 40 rotate in a stepping mode and makes the power source 50 reciprocate correspondingly. The controller will stop the power source 50 and rotary support 40 when all of the slots 32 are embedded by the fins 20.

Please refer to FIGS. 6-9, which show another embodiment of the invention. The method for mounting fins onto an annular seat of the second embodiment of the invention including the steps of:

a) providing a forming machine 10 for forming sheet metal 21 from a material 2;

b) cutting the sheet metal 21 to form a plurality of fins 20;

c) placing the annular seat 30 on a rotary support 40, wherein the annular seat 30 is provided with slots 32 on its outer surface; and d) reciprocatingly moving the rotary support 40 to make the slots 32 embedded by the fins 20 with rotation of the annular seat 30, wherein the rotary support 40 is moved by a driving device 60.

In this embodiment, the forming machine 10 includes a punching machine 11 and a mold set 12. The material 2 of fins 20 is conveyed by the punching machine 11 and pressed by the mold set 12 to form the sheet metal 21.

The forming machine 10 further includes a trough 13 for accommodating the fin 20. The trough 13 is driven by the power source 50 to convey the fin 20 so as to embed the fin 20 into the slots 32.

The driving device 60 is controlled by a controller (not shown). The controller makes the rotary support 40 rotate in a stepping mode and makes the driving device 60 reciprocate correspondingly. The controller will stop the driving device 60 when all of the slots 32 are embedded by the fins 20.

What is claimed is:

1. A method for mounting fins onto an annular seat comprising the steps of:

a) providing a forming machine for forming sheet metal from a material, wherein the forming machine further comprises a trough for accommodating one of the fins, and the trough is driven by a power source to convey the fin in the trough so as to embed the fin into one of the slots;

b) cutting the sheet metal to form a plurality of fins;

c) placing the annular seat on a rotary support, wherein the annular seat is provided with slots on an outer surface thereof; and d) one by one embedding the fins into the slots with rotation of the annular seat, wherein the fins are conveyed by the power source.

2. The method of claim 1, wherein the forming machine further comprises a punching machine and a mold set, and the material of the fins is conveyed by the punching machine and pressed by the mold set to form the sheet metal.

3. The method of claim 1, wherein the power source is a motor, hydraulic cylinder or robot hand.

4. The method of claim 1, wherein the rotary support and the power source are controlled by a controller, the controller makes the rotary support rotate in a stepping mode and makes the power source reciprocate correspondingly, and the controller will stop the power source and rotary support when all of the slots are embedded by the fins.

5. A method for mounting fins onto an annular seat comprising the steps of:
   a) providing a forming machine for forming sheet metal from a material, wherein the forming machine further comprises a trough for accommodating one of the fins, and the trough is driven by a power source to convey the fin in the trough so as to embed the fin into one of the slots;
   b) cutting the sheet metal to form a plurality of fins;
   c) placing the annular seat on a rotary support, wherein the annular seat is provided with slots on an outer surface thereof; and
   d) reciprocatingly moving the rotary support to make the slots embedded by the fins with rotation of the annular seat.

6. The method of claim 5, wherein the forming machine further comprises a punching machine and a mold set, and the material of the fins is conveyed by the punching machine and pressed by the mold set to form the sheet metal.

7. The method of claim 5, wherein the driving device is controlled by a controller, the controller makes the rotary support rotate in a stepping mode and makes the driving device reciprocate correspondingly, and the controller will stop the driving device when all of the slots are embedded by the fins.

* * * * *